United States Patent
Koyano et al.

(10) Patent No.: US 9,369,056 B2
(45) Date of Patent: *Jun. 14, 2016

(54) POWER CONVERTER

(71) Applicants: Nissan Motor Co., Ltd., Yokohama, Kanagawa (JP); National University Corporation Nagaoka University of Technology, Nagaoka-shi, Niigata (JP)

(72) Inventors: Hironori Koyano, Yamato (JP); Takamasa Nakamura, Atsugi (JP); Kouji Yamamoto, Chigasaki (JP); Junichi Itoh, Nagaoka (JP); Yoshiya Ohnuma, Nagaoka (JP)

(73) Assignees: Nissan Motor Co., Ltd., Yokohama (JP); NATIONAL UNIVERSITY CORPORATION NAGAOKA UNIVERSITY OF TECHNOLOGY, Nagaoka (JP)

( * ) Notice: Subject to any disclaimer, the term of this patent is extended or adjusted under 35 U.S.C. 154(b) by 179 days.

This patent is subject to a terminal disclaimer.

(21) Appl. No.: 14/349,696

(22) PCT Filed: Sep. 28, 2012

(86) PCT No.: PCT/JP2012/075096
§ 371 (c)(1),
(2) Date: Apr. 4, 2014

(87) PCT Pub. No.: WO2013/051475
PCT Pub. Date: Apr. 11, 2013

(65) Prior Publication Data
US 2014/0247636 A1    Sep. 4, 2014

(30) Foreign Application Priority Data
Oct. 7, 2011 (JP) ................... 2011-223288

(51) Int. Cl.
H02M 5/293    (2006.01)
H02M 5/297    (2006.01)
(Continued)

(52) U.S. Cl.
CPC ............ *H02M 5/293* (2013.01); *H02M 5/297* (2013.01); *H02M 7/003* (2013.01); *H02M 7/217* (2013.01); *H05K 7/1432* (2013.01)

(58) Field of Classification Search
CPC ............ H05K 7/1432; H05K 7/2089–7/209; H02M 5/293; H02M 7/003
See application file for complete search history.

(56) References Cited

U.S. PATENT DOCUMENTS 7,869,193 B2 *  1/2011  Nohara ................ H02M 5/271
                                                          361/624
8,031,479 B2 * 10/2011 Nagashima ........... H01L 23/642
                                                          361/611

(Continued)

FOREIGN PATENT DOCUMENTS

CN    103858329 A    6/2014
JP    2-130955 A     5/1990

(Continued)

Primary Examiner — Robert J Hoffberg
(74) Attorney, Agent, or Firm — Global IP Counselors, LLP

(57) ABSTRACT

A power converter is provided for direct conversion of multi-phase AC power to AC power. The power converter includes a conversion circuit and a plurality of output lines. The conversion circuit has first and second switching elements that are configured to be connected to phases of the multi-phase AC power for bidirectional switching of energizing current. The output lines are connected to the conversion circuit. The first and second switching elements have output terminals. The output terminals of the first and second switching elements are arranged in first and second rows. The output terminals of the first and second switching elements face each other. The first output lines include two first output lines including first and second widely shaped bus bars connected to the output terminals of the first and second switching elements, respectively. The first output lines extending out in one direction, and line up in an upright direction.

19 Claims, 5 Drawing Sheets

(51) Int. Cl.
*H02M 7/217* (2006.01)
*H02M 7/00* (2006.01)
*H05K 7/14* (2006.01)

(56) References Cited

U.S. PATENT DOCUMENTS

| | | | | |
|---|---|---|---|---|
| 8,058,554 | B2 * | 11/2011 | Nakamura | H01L 24/40 174/68.2 |
| 8,500,491 | B2 * | 8/2013 | Suzuki | H01L 23/49861 439/626 |
| 8,964,387 | B2 * | 2/2015 | Meinecke | H02H 7/065 165/185 |
| 2009/0052134 | A1 * | 2/2009 | Casteel | H01L 23/473 361/699 |
| 2014/0085950 | A1 * | 3/2014 | Koyano | H02M 5/293 363/123 |
| 2014/0085956 | A1 * | 3/2014 | Koyano | H02M 5/293 363/156 |
| 2014/0104913 | A1 * | 4/2014 | Koyano | H02M 5/293 363/149 |
| 2014/0126263 | A1 * | 5/2014 | Koyano | H02M 5/293 363/148 |
| 2014/0185326 | A1 * | 7/2014 | Koyano | H02M 5/293 363/2 |
| 2014/0192578 | A1 * | 7/2014 | Koyano | H02M 5/293 363/149 |
| 2014/0247635 | A1 * | 9/2014 | Koyano | H02M 5/297 363/148 |

FOREIGN PATENT DOCUMENTS

| | | | |
|---|---|---|---|
| JP | 02130955 A | * | 5/1990 |
| JP | 06261556 A | * | 9/1994 |
| JP | 2001-45772 A | | 2/2001 |
| JP | 2004-236374 A | | 8/2004 |
| JP | 2005-65357 A | | 3/2005 |
| JP | 2006-333590 A | | 12/2006 |
| JP | 2011-120358 A | | 6/2011 |

* cited by examiner

POWER CONVERTER

CROSS-REFERENCE TO RELATED APPLICATIONS

This application is a U.S. National stage application of International Application No. PCT/JP2012/075096, filed Sep. 28, 2012, which claims priority to Japanese Patent Application No. 2011-223288 filed in Japan on Oct. 7, 2011.

BACKGROUND

1. Field of the Invention

The present invention relates to a power converter for direct conversion of AC power to a desired AC power frequency.

2. Background Information

A matrix converter is one known power converter in which the parts constituting the device are few in number, making possible a smaller device; and which is able to convert AC power directly and efficiently into AC power (Japanese Laid-Open Patent Application No. 2006-333590).

SUMMARY

However, a problem with the aforedescribed matrix converter of the prior art is that because the multiple IGBT are arranged in series, and the output lines from the IGBT are connected in consolidated fashion, the output lines are long. Particularly in a power converter in which high-frequency current must flow through the output lines, longer wire lengths result in susceptibility to the effects of the L component.

An object of the present invention is to provide a power converter whereby the output lines can be shorter.

The present invention solves the above-mentioned problem through a plurality of switching means constituting a power conversion circuit, in which bus bars of wide shape are arranged lining up in an upright direction such that the output lines lead out in one direction.

According to the present invention, a plurality of switching means are arranged lining up, whereby the output lines can be lead out in one direction, and the output lines can be made shorter.

BRIEF DESCRIPTION OF THE DRAWINGS

Referring now to the attached drawings which form a part of this original disclosure.

DETAILED DESCRIPTION OF THE EMBODIMENTS

Figure 1:
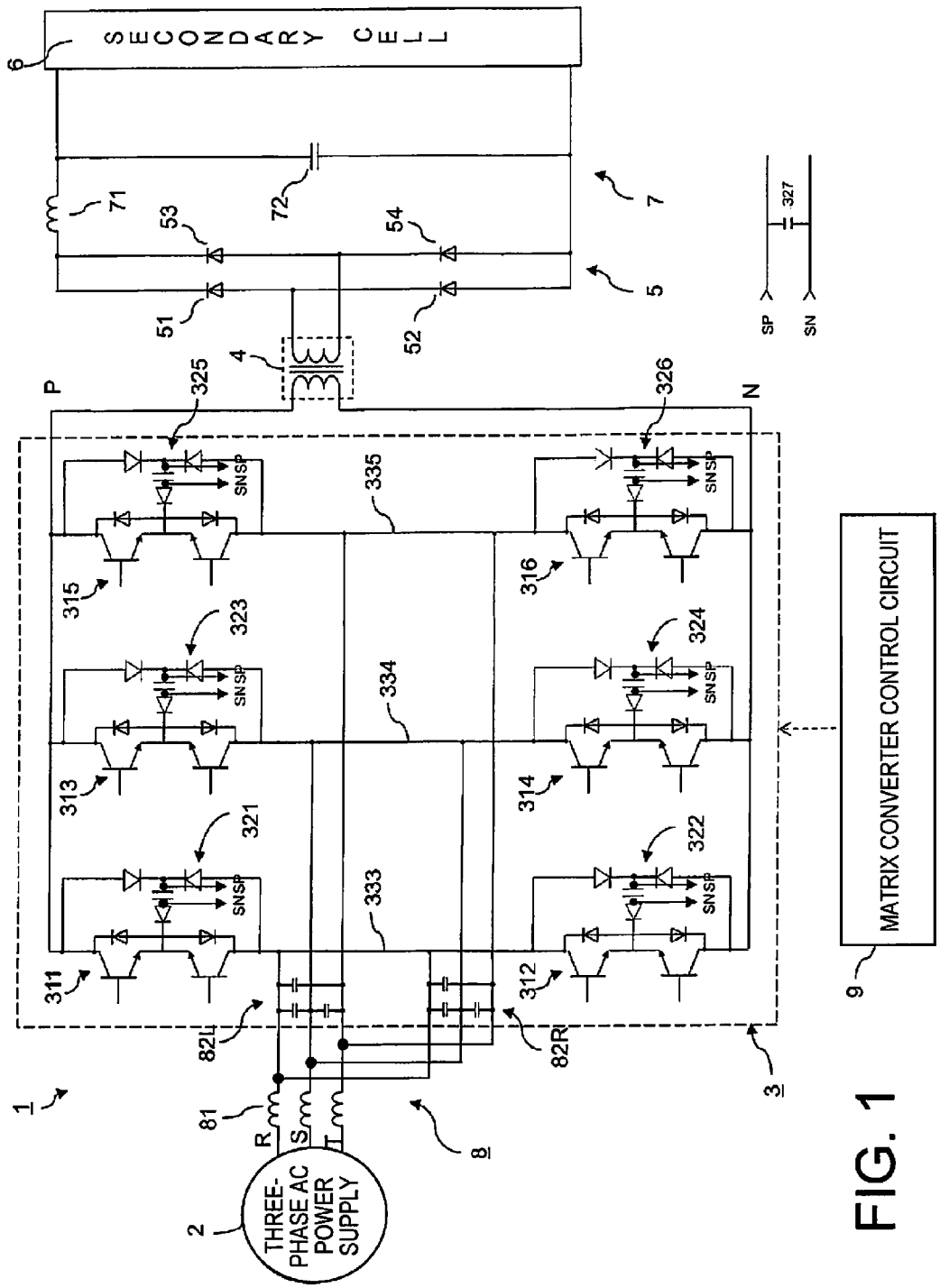
FIG. 1 is an electrical circuit diagram showing a power conversion system to which an embodiment of the present invention is applied.

An overview of a power conversion system to which an embodiment of the present invention is applied shall be described first, making reference to FIG. 1. The power conversion system 1 of the present example is a system in which three-phase AC power supplied by a three-phase AC power supply 2 is directly converted to single-phase AC power by a power converter 3 according to an embodiment of the present invention, which power is then stepped up or stepped down, as appropriate, by a transformer 4, and converted to DC voltage by a rectifier 5, for use in charging a secondary cell 6. 7 denotes a smoothing circuit.

In the power conversion system 1 of the present example, the phases (shown as phase R, phase S, and phase T) of the output lines which supply three-phase AC power from the three-phase AC power supply 2 are provided with a filter circuit 8 for attenuation of harmonics, as a countermeasure against noise. The filter circuit 8 of the present example is provided with three filter reactors 81 connected to the phases R, S, and T, and with six filter capacitors 82L, 82R connected between the phases R, S, and T. The layout of the filter capacitors 82L, 82R (shown by filter capacitors 821-836 in FIGS. 2 and 4) shall be discussed later.

In the power conversion system 1 of the present example, three-phase AC power is supplied to the power converter 3 through the filter circuit 8, and converted to single-phase AC power. The power converter 3 of the present example is provided with six bidirectional switching elements 31 (311-316) arrayed in a matrix, in corresponding fashion to phase R, phase S, and phase T. In the following description, symbol 31 shall be employed when referring generically to any one bidirectional switching element, whereas symbols 311-316 shall be employed when referring to specific elements among the six bidirectional switching elements as shown in FIG. 1.

Each of the bidirectional switching elements 31 in the present example is respectively constituted by an IGBT module in which an IGBT (a type of semiconductor switching element) is combined with a freewheeling diode in an anti-parallel connection. The constitution of a single bidirectional switching element is not limited to that illustrated here, and a different constitution, for example, one involving an anti-parallel connection of two reverse blocking IGBT elements, would also be acceptable.

In order to protect the bidirectional switching elements 31 from surge voltage generated in association with ON/OFF operation of the bidirectional switching elements 31, the bidirectional switching elements 31 are respectively provided with snubber circuits 32 (321-326) which are a combination of three diodes and one snubber capacitor 327 (see the circuit diagram at lower right in the drawing) at the input side and the output side of the bidirectional switching element 31. In the following description, symbol 32 shall be employed when referring generically to any single snubber circuit, whereas symbols 321-326 shall be employed when referring to specific snubber circuits among the six snubber circuits as shown in FIG. 1.

The power conversion system 1 of the present example is provided with a matrix converter control circuit 9 for respective ON/OFF control of the bidirectional switching elements 31 of the power converter 3. The matrix converter control circuit 9 inputs the voltage value supplied by the three-phase AC power supply 2, the currently output DC current value, and a target current command value, and on the basis thereof, controls the respective gate signals of the bidirectional switching elements 31, and adjusts the single-phase AC power output to the transformer 4, to thereby obtain DC power that matches the target.

The voltage of the single-phase AC power converted by the power converter 3 is stepped up or stepped down to a predetermined voltage by the transformer 4. The rectifier 5 is provided with four rectifier diodes 51-54, and converts voltageregulated single-phase AC power to DC power. The smoothing circuit 7 is provided with a coil 71 and a capacitor 72, and smoothes pulsating current included in rectified DC current, to produce a condition that more closely approximates DC.

In the power conversion system 1 of the present example constituted in the above manner, three-phase AC power supplied by the three-phase AC power supply 2 is directly converted to single-phase AC power by the power converter 3, and after regulation to appropriate voltage, is converted to DC power. The secondary cell 6 is charged thereby. The power conversion system 1 discussed above is merely one example of application of the power converter 3 according to the present invention, and the present invention is not limited to application in the power conversion system in question. Specifically, application in other power conversion systems is possible as well, provided that at least the power being converted and/or the converted power is multi-phase AC power.

Figure 2:
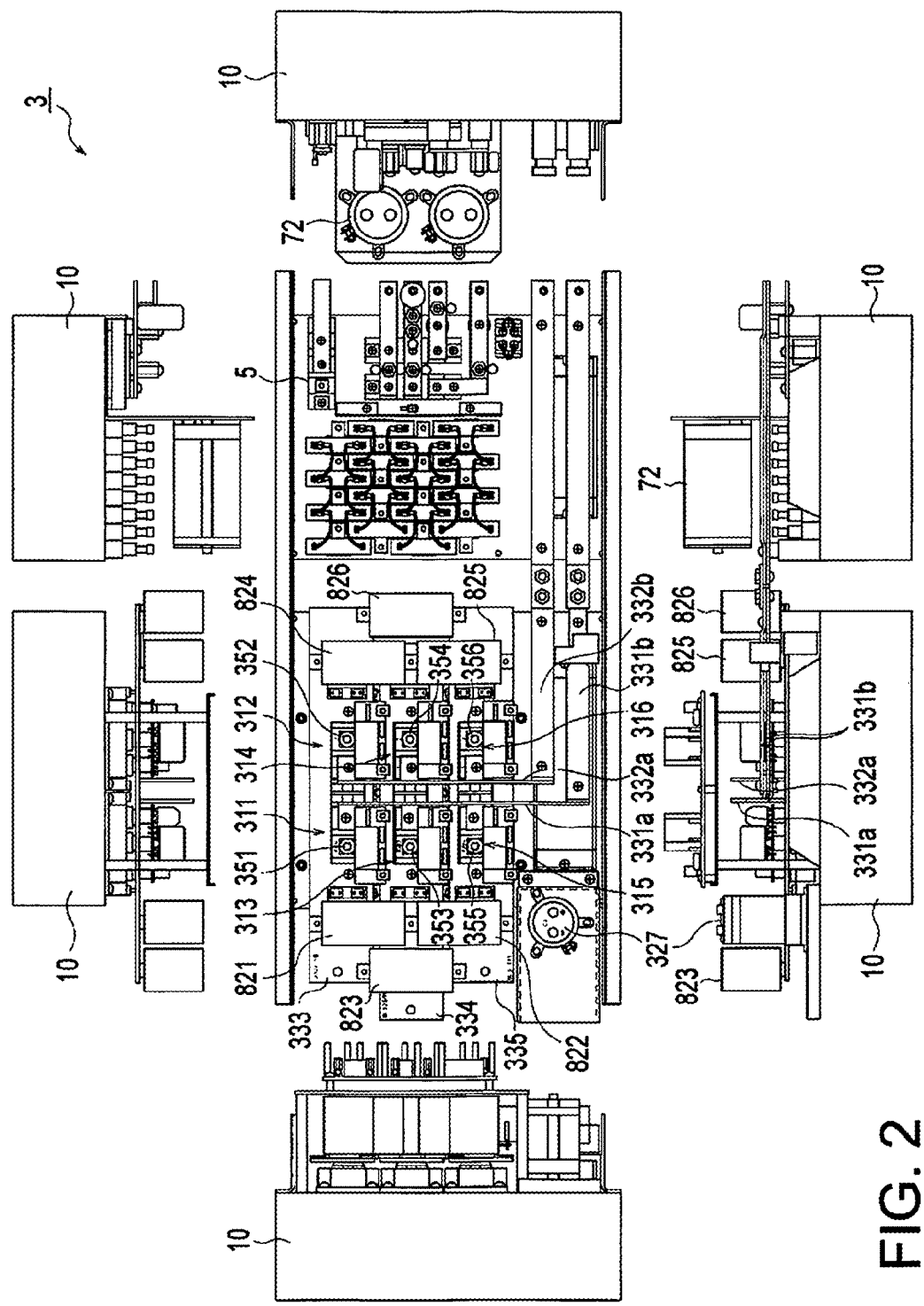
FIG. 2 are a plan view, left/right side views, front view, and back view showing the power converter according to an embodiment of the present invention.
Figure 3:
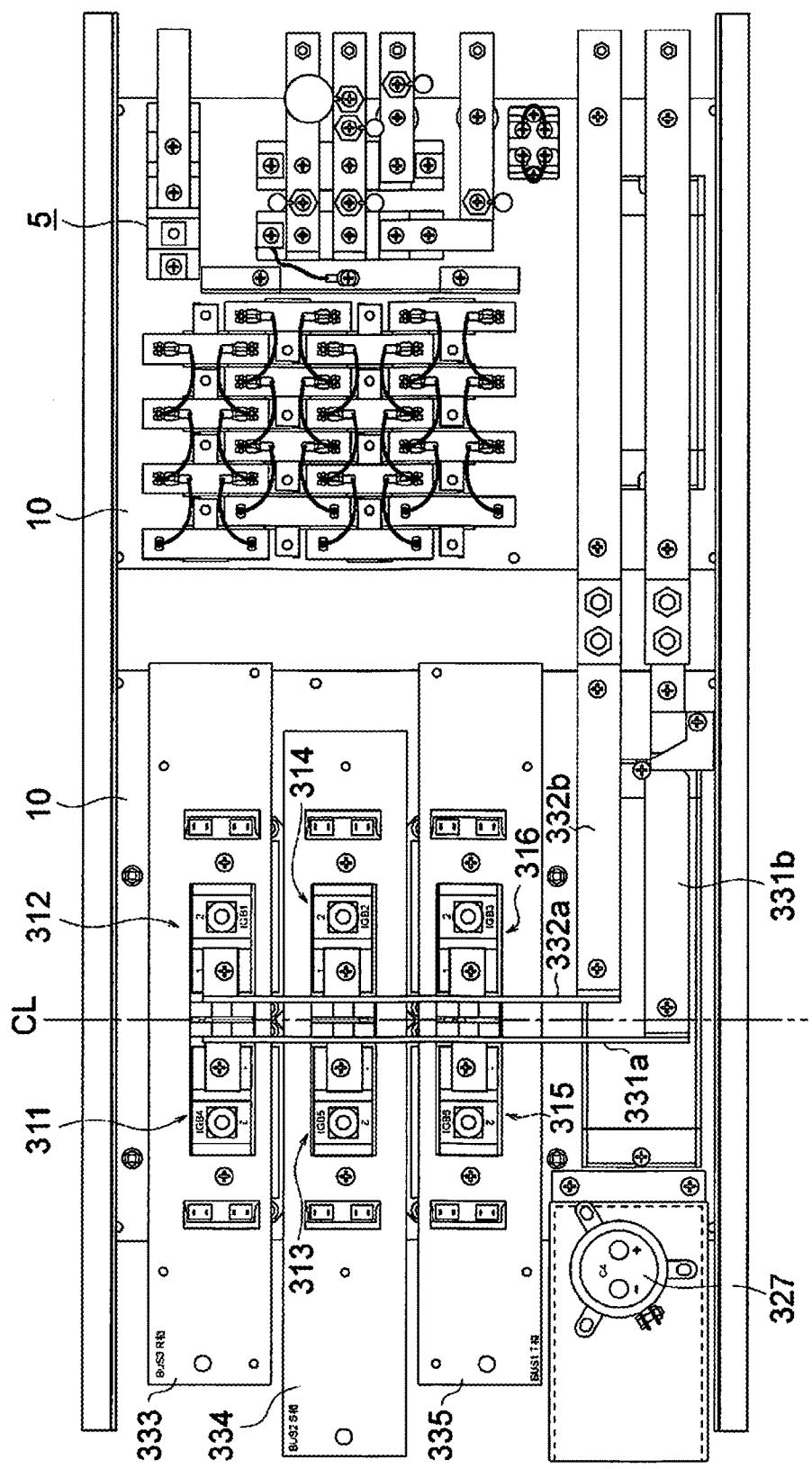
FIG. 3 is a plan view of the layout of an IGBT, filter capacitors, and bus bars in the power converter of FIG. 2.

Next, the constitution of arrangement of the components that constitute the power converter 3 shall be described, making reference to FIGS. 2 to 5. Components assigned the same symbols as in FIG. 1 indicate those having mutually corresponding relationships. In FIGS. 2 and 3, the rectifier 5 and the smoothing circuit 7 are shown besides the power converter 3 of the present example, but the transformer 4 of FIG. 1 lies outside of the drawing.

FIG. 3 is a plan view showing a mid-assembly state in which the six bidirectional switching elements 31 (any one of which is also referred to as an IGBT module) have been mounted on the upper surface of a heat sink 10, and bus bars for connecting the terminals of the bidirectional switching elements 31 have been mounted thereon. FIG. 2 is a plan view, left/right side views, front view, and back view showing the assembled state in which the three diodes constituting the snubber circuits 32 and the six filter capacitors 82 of the filter circuit 8 have been mounted thereon. The components constituting the power converter 3 of the present example overlap one another in plan view, and therefore in the following description, relevant portions are in some instances shown in separate drawings (FIG. 4, 5) to which reference shall be made as well.

Figure 5:
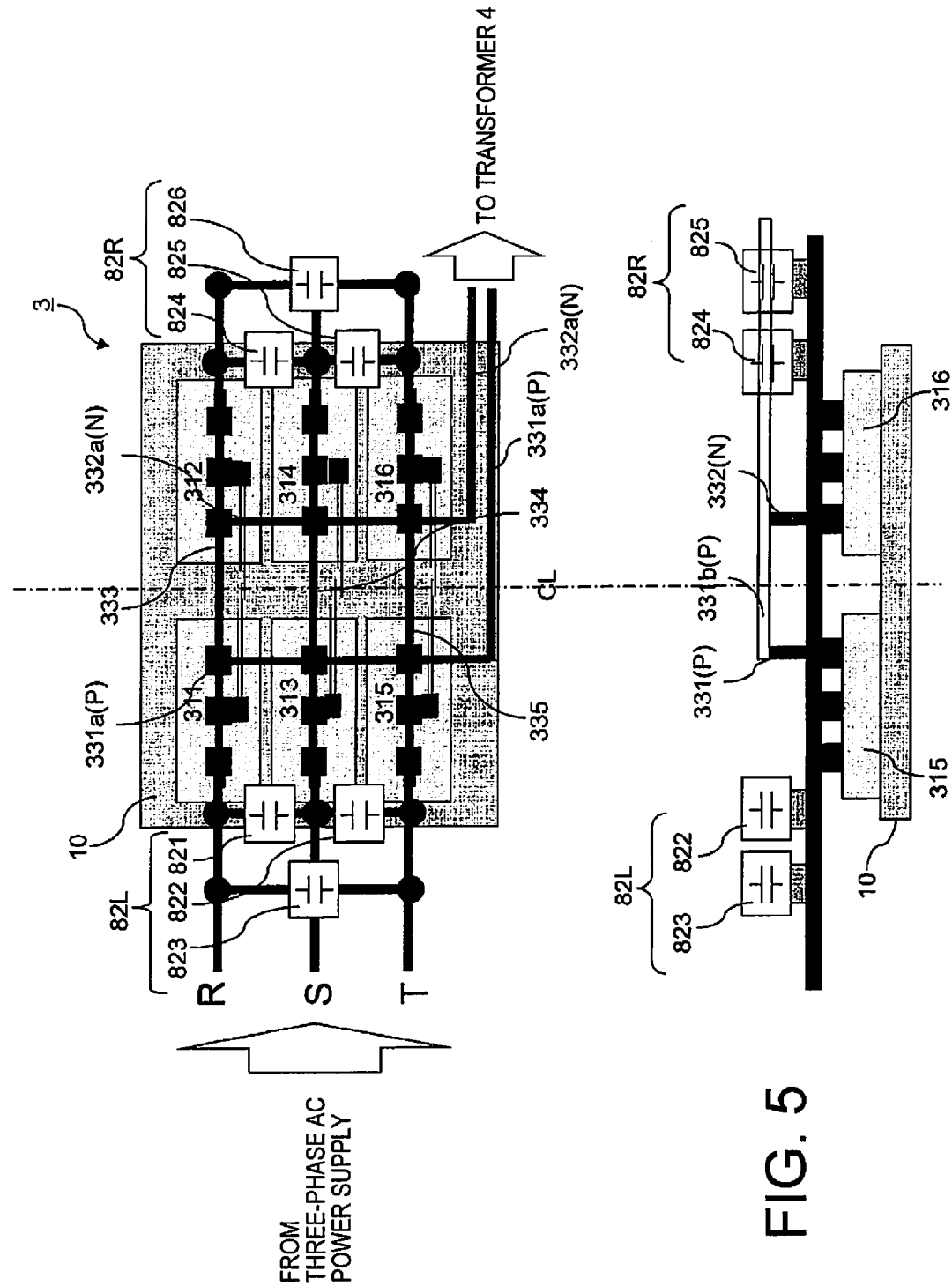
FIG. 5 is a plan view and front view showing in simplified form a portion of the power converter of FIG. 2.

As shown in FIGS. 3 and 5, the bidirectional switching elements 31 of the present example are provided, on the upper surface of the module package, with an input terminal of the bidirectional switching element 31, output terminal, and two IGBT midpoint terminals constituting a pair. Of the six bidirectional switching elements 311-316 shown in FIGS. 3 and 5, the terminals at the left ends of the three bidirectional switching elements 311, 313, 315 on the left side are input terminals (in FIG. 3 these are hidden by the bus bars 333, 334, 335), the terminals at the right ends are output terminals, and the center terminals are midpoint terminals. Of the six bidirectional switching elements 311-316 shown in FIGS. 3 and 5, the terminals at the right ends of the three bidirectional switching elements 312, 314, 316 on the right side are input terminals (in FIG. 3 these are hidden by the bus bars 333, 334, 335), the terminals at the left ends are output terminals, and the center terminals are midpoint terminals. The gate terminals of the bidirectional switching elements 31 are provided to another section of the module package.

As shown in FIGS. 2, 3, and 5, the six bidirectional switching elements 311-316 are fastened to the upper surface of the heat sink 10 by fastening means such as bolts or the like. As shown in the drawings, these six bidirectional switching elements 311-316 are respectively arranged lining up to the left and right of a center line CL, in pairs constituted by the bidirectional switching elements 311 and 312, the bidirectional switching elements 313 and 314, and the bidirectional switching elements 315 and 316. In other words, the pairs of the two bidirectional switching elements 311 and 312, the bidirectional switching elements 313 and 314, and the bidirectional switching elements 315 and 316 are respectively arranged lining up to the left and right from the center line CL, along the direction of extension of the three terminals (the input terminal, midpoint terminal, and output terminal) of a single bidirectional switching element 31. Herein, this array is also referred to as "arrangement in rows with respect to the center line CL or to output lines P, N connecting the output terminals." A bidirectional switching element pair refers to a pair of bidirectional switching elements connected to the same phase R, S, or T input line.

By arranging the pairs constituted by the bidirectional switching elements 311 and 312, the bidirectional switching elements 313 and 314, and the bidirectional switching elements 315 and 316 so as to line up to the left and right of the center line CL in this manner, the layout is one in which the output lines P, N (bus bars 331a, 332a) can be led out to minimum length in one direction. Because output of high-frequency AC power over longer wire lengths entails greater susceptibility to the effect of the L component, the effect of the L component can be minimized through the arrangement in the present example. Specifically, the output lines P, N will include the output lines that approximate straight lines, at least up to the transformer 4.

As mentioned above, the terminals at the right ends of the bidirectional switching elements 311, 313, 315 to the left side of the center line CL are all output terminals, while the terminals at the left ends are all input terminals. Conversely, the terminals at the left ends of the bidirectional switching elements 312, 313, 316 to the right side of the center line CL are all output terminals, while the terminals at the right ends are all input terminals.

The bus bars 333, 334, 335 the input lines R, S, T of the three-phase AC power supply 2 lead towards the center line CL and connect to the input terminals at the left ends of the bidirectional switching elements 311, 313, 315 to the left side of the center line CL, whereas the input lines R, S, T constituted by further extension of these bus bars 333, 334, 335 are connected to the input terminals at the right ends of the bidirectional switching elements 312, 314, 316 to the right side of the center line CL. Specifically, phase R is connected to the input terminals of the bidirectional switching elements 311, 312, phase S is connected to the input terminals of the bidirectional switching elements 313, 314, and phase T is connected to the input terminals of the bidirectional switching elements 315, 316, respectively. The bus bars 333, 334, 335 constituting the input lines R, S, T lead in one direction from either left or right, and are then extended to the right or left in the other direction, whereby the distance in the left-right direction of the heat sink 10 can be shorter, and the filter capacitors 82L, 82R (discussed later) can be arranged uniformly, contributing to a simpler layout and conserving space.

The bus bar 333 constituting the input line R is connected between the input terminals of the bidirectional switching elements 311 and 312 constituting a pair arranged to left and right of the center line CL, the bus bar 334 constituting the input line S is connected between the input terminals of the bidirectional switching elements 313 and 314, and the bus bar 335 constituting the input line T is connected between the input terminals of the bidirectional switching elements 315 and 316. The wires corresponding to these bus bars 333, 334, 335 are shown by like symbols in the equivalent circuit of FIG. 1 as well. The connection structure afforded by these bus bars 333-335 is not essential in terms of the functionality of the power converter 3.

The pairs constituted by the bidirectional switching elements 311 and 312, the bidirectional switching elements 313 and 314, and the bidirectional switching elements 325 and 316 arranged to left and right from the center line CL are respectively connected by these bus bars 333, 334, 335, whereby the filter capacitors 82L, 82R provided between phases can be mutually shared. Specifically, a filter capacitor 821 is provided between phase R and phase S at the left side in the drawing, and a filter capacitor 824 is provided between phase R and phase S at the right side, the input terminals of the bidirectional switching elements 311, 312 to which phase R is input being connected by the bus bar 333. Consequently, noise from phase R of the three-phase AC power supply 2 is filtered through cooperation by the two filter capacitors 821, 824, whereby a single filter capacitor can be smaller in capacity, as a result of which the filter capacitor can be smaller in size. The same is true for phase S and phase T as well.

These bus bars 333-335 and the bus bars 331, 332 constituting the output lines P, N intersect in plan view, but as shown in front view in FIGS. 2 and 5, the bus bars 331, 332 of the output lines P, N are established at locations higher than the bus bars 333-335 which interconnect the input terminals, thereby providing a constitution that avoids interference resulting from three-dimensional intersection.

In FIG. 1, the input lines R, S, T leading from the three-phase AC power supply 2 to the power converter 3 are constituted so as to branch between the filter reactor 81 and the filter capacitors 82L, 82R, but may instead branch to the upstream side from the filter reactor 81, furnishing the filter reactor 81 respectively to the branched input lines R, S, T.

The single bus bar 331a constituting the output line P of the power converter 3 is connected to the output terminals at the right ends of the bidirectional switching elements 311, 313, 315 to the left side from the center line CL, whereas the single bus bar 332a constituting the output line N of the power converter 3 is connected to the output terminals at the left ends of the bidirectional switching elements 312, 314, 316 to the right side from the center line CL. These bus bars 331a, 332a are connected at the distal end side to the transformer 4. The following bus bars, including these bus bars 331a, 332a, are constituted by conductors of excellent conductivity, such as copper or the like.

The pair of bus bars 331a, 332a constituting the output lines P, N of the power converter 3 are relatively wider in shape than bus bars 331b, 332b discussed below, and as shown in plan view and front view in FIG. 2, are arranged lining up upright with respect to a principal surface of the heat sink 10. The width dimensions of these bus bars 331a, 332a are selected according to the rated current; wider shape allows for greater current flow, due to the skin effect observed with a high-frequency current. Moreover, by adopting a wider shape and an upright arrangement, the distance between the left-side bidirectional switching elements 311, 313, 315 and the right-side bidirectional switching elements 312, 314, 316 can be shorter, and the power converter 3 can be smaller in the left-right direction.

In contrast to this, the pair of bus bars 331b, 332b constituting the output lines P, N of the power converter 3 are connected and fastened to the distal ends of the bus bars 331a, 332a, and arranged lining up in a horizontal direction with respect to a principal surface of the heat sink 10 as shown in plan view and front view in FIG. 2. While these bus bars 331b, 332b are relatively narrower in width than the bus bars 331a, 332a, as shown in front view in FIG. 2, each single bus bar 331b, 332b respectively includes multiple (in the present example, two) bus bars arranged stacked at predetermined spacing. Due to the relatively narrower width with respect to the 331a, 332a, if constituted by a single bus bar, the current density of high-frequency current would be greater due to the skin effect; however, by virtue of being constituted of a plurality of bus bars, high-frequency current flow comparable to that of the bus bars 331b, 332b can be achieved. By arranging the bus bars 331b, 332b to line up in a horizontal direction, the right-end connection terminals to the transformer 4 can be arrayed in the same orientation, as shown in plan view in FIG. 2.

Figure 4:
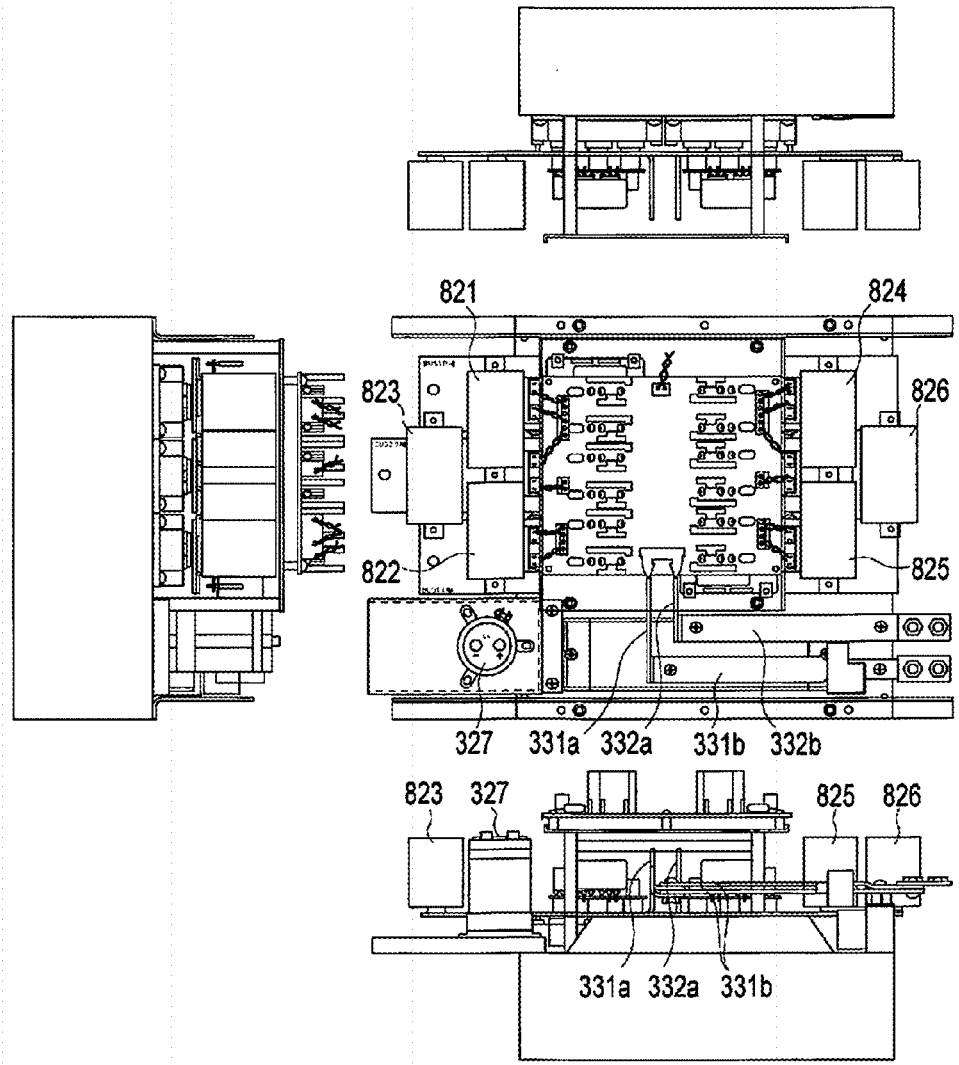
FIG. 4 is a plan view, side view, front view, and back view showing a portion of the power converter of FIG. 2.

In the present example, the filter circuit 8 includes the six filter capacitors 821-826 respectively arranged in sets of three on the input lines, to the left side and the right side of the center line CL as shown in FIGS. 2, 4, and 5. The filter capacitor 821 on the left side is provided between phase R and phase S corresponding to the input terminal of the bidirectional switching element 311. Likewise, the filter capacitor 822 on the left side is provided between phase S and phase T corresponding to the input terminal of the bidirectional switching element 313, and the filter capacitor 823 on the left side is provided between phase T and phase R corresponding to the input terminal of the bidirectional switching element 315. The filter capacitor 824 on the right side is provided between phase R and phase S corresponding to the input terminal of the bidirectional switching element 312, the filter capacitor 825 on the right side is provided between phase S and phase T corresponding to the input terminal of the bidirectional switching element 314, and the filter capacitor 826 on the right side is provided between phase T and phase R corresponding to the input terminal of the bidirectional switching element 316.

By arranging the six filter capacitors 821-826 in sets of three to the left and right of the center line CL in respectively corresponding fashion to the six bidirectional switching elements 311-316 which have been arranged in sets of three each to the left and right of the center line CL in this manner, the distances over which the respective connecting wires of the filter capacitors 821-826 and the bidirectional switching elements 311-316 are routed can be shorter.

In the present example, the filter capacitors 821-826 in sets of three respectively situated at left and right are arranged to the outside, with respect to the center line CL, from the area in which the six bidirectional switching elements 311-316 are provided. In specific terms, as shown in FIGS. 2, 4, and 5, the elements are fastened to the upper part of the bus bars 333, 334, 335. By arranging the filter capacitors 821-826 further to the outside from the bidirectional switching elements 311-316, the spacing in the left-right direction between the left and right bidirectional switching elements 311-316 can be shortest, the span of the heat sink 10 in the left-right direction can be set to the shortest span, and as a result the heat sink 10 can be more compact, as compared with the case in which the six filter capacitors are arrayed at the center.

Next, the mounted condition of the filter capacitors 821-826 provided in sets of three respectively to the left and right of the center line CL will be described on the basis of the plan views and side views of the actual device shown in FIGS. 2 to 4.

Before doing so, the connection configuration of the bus bars shall be described again. As shown in FIG. 3, the bus bar 331a connects the output terminals of the bidirectional switching elements 311, 313, 315, and serves as the output line P leading to the transformer 4 through the bus bar 331b. The bus bar 332a connects the output terminals of the bidirectional switching elements 312, 314, 316, and serves as the output line N leading to the transformer 4 through the bus bar 332b.

The bus bar 333 is a bus bar to which the phase R input line is connected and which connects the input terminals of the bidirectional switching elements 311 and 312, and extends to areas to the outside to left and right from both input terminals, in which areas the filter capacitors 821, 823, 824, 826 are connected directly. Likewise, the bus bar 334 is a bus bar to which the phase S input line is connected and which connects the input terminals of the bidirectional switching elements 313 and 314, and extends to areas to the outside to left and right from both input terminals, in which areas the filter capacitors 821, 822, 824, 825 are connected directly. The bus bar 335 is a bus bar to which the phase T input line is connected and which connects the input terminals of the bidirectional switching elements 315 and 316, and extends to areas to the outside to left and right from both input terminals, in which areas the filter capacitors 822, 823, 825, 826 are connected directly. Because the filter capacitors 821-826 directly connect to the bus bars 333-335 in this way, the connection structure is simpler.

As shown in FIGS. 2, 4, and 5, the filter capacitors 82L-82R, in sets of three respectively arranged at left and right, are arranged to the outside with respect to the center line CL, and moreover are arranged such that the centers of the filter capacitors 821, 822, 823 are positioned at the apices of a triangle (more preferably an isosceles triangle or an equilateral triangle) one apex of which faces towards an outward direction. By arranging the three filter capacitors 82L, 82R on the apices of a triangle, the wire lengths among the capacitors can be set to the shortest distance, the power converter 3 can be made more compact, and the capacitors can be tuned to one another. Moreover, by arranging one apex to face towards an outward direction, the balance among the wires connecting the capacitors can be improved, and the distances to the bus bars 333, 334, 335, can be shorter, as compared to an array in which one apex faces towards an inward direction. Furthermore, by arranging the filter capacitors 821-826 on the upper surfaces of the bus bars, in other words, arranging the filter capacitors 821-826 on the opposite side of the bus bars from the bidirectional switching elements 311-316, the degree of freedom in design of the layout of the filter capacitors 821-826 is greater.

Next, an example of mounting the three diodes and the one snubber capacitor 327 constituting the snubber circuit 32 shown in FIG. 1 will be described. As shown in FIG. 1, in the snubber circuit 321 of the bidirectional switching element 311 for example, one terminal is connected to the input terminal of the bidirectional switching element 311, another terminal is connected to the midpoint terminal of the bidirectional switching element, and yet another terminal is connected to the output terminal of the bidirectional switching element 311, respectively. Therefore, as shown in FIG. 2, the three diodes are respectively fastened and connected to brackets 351-356 comprising conductors which are connected to the midpoint terminals of the bidirectional switching elements 31L, 31R.

In the present example, a relatively large electrolytic capacitor is used for the snubber capacitor 327, and the snubber capacitor 327 is shared by the six snubber circuits 321-326 (see FIG. 2). The snubber capacitor 327 and the three diodes are connected by wires.

The embodiment shown above has the following effects.

1) According to the present example, the six filter capacitors 821-826, in sets of three to the left and right of the center line CL, are arranged in respectively corresponding fashion to the six bidirectional switching elements 311-316 which have been arranged in sets of three to the left and right of the center line CL, whereby the distances over which the respective connecting wires of the filter capacitors 821-826 and the bidirectional switching elements 311-316 are routed can be shorter.

2) In the present example, the pairs of the bidirectional switching elements 311 and 312, the bidirectional switching elements 313 and 314, and the bidirectional switching elements 315 and 316 are respectively arranged lining up to the left and right of the center line CL, whereby the layout is such that the output lines P, N (the bus bars 331a, 332a) can be lead out a short distance in one direction. Consequently, while output of high-frequency AC power over longer wire lengths entails greater susceptibility to the effect of the L component, the effect of the L component can be minimized through the arrangement in the present example.

3) In the present example, the pair of bus bars 331a, 332a constituting the output lines P, N are relatively wider in shape than the bus bars 331b, 332b, and are arranged lining up upright with respect to a principal surface of the heat sink 10. The wider shape allows for greater current flow, due to the skin effect observed with a high-frequency current. Moreover, by adopting a wider shape and an upright arrangement, the distance between the left-side bidirectional switching elements 311, 313, 315 and the right-side bidirectional switching elements 312, 314, 316 can be shorter, and the power converter 3 can be smaller in the left-right direction.

4) In the present example, the bus bars 331b, 332b constituting the output lines P, N are narrower in width relative to the bus bars 331a, 332a, and a single bus bar includes multiple bus bars stacked at predetermined spacing, and furthermore arranged lining up in a horizontal direction with respect to a principal surface of the heat sink 10. Due to the narrower width of the bus bars 331b, 332b relative to the bus bars 331a, 332a, monopolization of space is kept to a minimum, and because the bus bars can be lined up in a horizontal direction, the connection terminals to the transformer 4 can be arrayed in the same orientation. Moreover, because a single bus bar includes multiple bus bars stacked at predetermined spacing, high-frequency current flow comparable to that through the bus bars 331a, 332a can be achieved due to the skin effect.

5) In the present example, the filter capacitors 821-826 in sets of three respectively situated at left and right are arranged to the outside, with respect to the center line CL, from the area in which the six bidirectional switching elements 311-316 are provided, whereby the spacing in the left-right direction between the left and right bidirectional switching elements 31L, 31R can be shortest. Consequently, the span of the heat sink 10 in the left-right direction can be set to the shortest span, and as a result the heat sink 10 can be more compact.

6) In the present example, the bus bars 333, 334, and 335 constituting the input lines lead in one direction from either left or right, and extend to right or left in the other direction, thereby respectively connecting the input terminals of the pairs of the bidirectional switching elements 311 and 312, of the bidirectional switching elements 313 and 314, and of the bidirectional switching elements 315 and 316 which are arranged to left and right of the center line CL. In so doing, the span of the heat sink 10 in the left-right direction can be shorter, and the filter capacitors 82L, 82R (discussed later) can be arranged uniformly, contributing to a simpler layout and conserving space. Moreover, the filter capacitors 82L, 82R provided between phases can be mutually shared, whereby a single filter capacitor can be smaller in capacity, as a result of which the filter capacitor can be smaller in size.

7) In the present example, the filter capacitors 821-826 are arranged on the upper surfaces of the bus bars 333, 334, 335, in other words, the filter capacitors 821-826 are arranged on the opposite side of the bus bars from the bidirectional switching elements 311-316, thereby affording a greater degree of freedom in design of the layout of the filter capacitors 821-826.

8) In the present example, the three filter capacitors 821, 822, 823 are arranged on the apices of a triangle, whereby the wire lengths among the capacitors can be set to the shortest distance, the power converter 3 can be made more compact, and the capacitors can be tuned to one another.

9) In the present example, the three filter capacitors arranged a triangle are arranged such that one apex faces towards an outward direction, whereby the balance among the wires connecting the capacitors can be improved, and the distances to the bus bars 333, 334, 335, can be shorter, as compared to an array in which one apex faces towards an inward direction.

The present invention can be modified, as appropriate, to embodiments other than the preceding. While modifications of the present invention are described below, the present invention should not be construed as being limited to the preceding embodiment or to the embodiments hereinbelow.

In the preceding embodiment, the filter capacitors 82L, 82R, in sets of three respectively to the left and right, are arranged to the outside, with respect to the center line CL, from the bidirectional switching elements 311, 313, 315 and 312, 314, 316, but could instead be arranged between the bidirectional switching elements 311, 313, 315 and 312, 314, 316 which are arrayed to left and right with respect to the center line CL.

In the preceding embodiment, of the six bidirectional switching elements 311-316, the bidirectional switching elements 311, 313, 315 are arranged to the left side, and the bidirectional switching elements and 312, 314, 316 are arranged to the right side, with respect to the center line CL. However, it would be acceptable to arrange the bidirectional switching elements 311, 313, 315 and the bidirectional switching elements and 312, 314, 316 along the center line CL.

In the preceding embodiment, of the six bidirectional switching elements 311-316, the bidirectional switching elements 311, 313, 315 are arranged to the left side, and the bidirectional switching elements and 312, 314, 316 arranged to the right side, with respect to the center line CL, while furnishing the input terminals and the output terminals of the bidirectional switching elements in line-symmetric fashion side with respect to the center line CL. However, it would be acceptable also to arrange the bidirectional switching elements 311, 313, 315 to the left side, and arrange the bidirectional switching elements 312, 314, 316 to the right side, with respect to the center line CL, while adopting identical arrangements for the input terminals and the output terminals of the bidirectional switching elements.

In the preceding embodiment, the filter capacitors 821-826 are provided between phases, doing so such that each single one corresponds respectively to one of the six bidirectional switching elements 311-316. However, the filter capacitors 821-826 could instead be provided between phases, doing so in such a way that several correspond respectively to one of the six bidirectional switching elements 311-316. In this case, the filter capacitors may be arranged at the center of the power converter 3, or outside the power converter 3. When arranged at the center of the power converter 3, empty space can be utilized, whereby the size of the power converter 3 can be minimized to the greatest possible extent.

The aforementioned bidirectional switching elements 311, 313, 315 correspond to the first switching means according to the present invention; the aforementioned bidirectional switching elements 312, 314, 316 correspond to the second switching means according to the present invention; the aforementioned power converter 3 corresponds to the conversion circuit according to the present invention; the aforementioned bus bars 331a, 332a correspond to the first output lines according to the present invention; and the aforementioned bus bars 331b, 332b correspond to the second output lines according to the present invention.

The invention claimed is:

1. A power converter for direct conversion of multi-phase AC power to a single phase AC power, the power converter comprising:
   a conversion circuit having a plurality of first switching elements configured to be connected to phases of the multi-phase AC power for bidirectional switching of energizing current, and a plurality of second switching elements configured to be connected to the phases of the multi-phase AC power, for bidirectional switching of energizing current; and
   a plurality of output lines connected to the conversion circuit;
   the first switching elements having output terminals and the second switching elements having output terminals, the output terminals of the first switching elements being linearly arranged, the output terminals of the second switching elements being linearly arranged and facing the output terminals of the first switching elements,
   the output lines being configured to output the single phase AC power, the output lines including a pair of first output lines including a first widely shaped bus bar connected to the output terminals of the first switching elements and a second widely shaped bus bar connected to the output terminals of the second switching elements, the first output lines extending out in one direction, and lining up in an upright direction.

2. The power converter according to claim 1, wherein the output lines include a pair of second output lines that are connected to distal ends of the first output lines, respectively, the second output lines being narrower in width than the first output lines, and arranged in a horizontal direction;
   each of the second output lines has a plurality of output lines being stacked at predetermined spacing from each other.

3. The power converter according to claim 2, further comprising
   a plurality of input lines connected to a respective one of input terminals of the first switching elements and the second switching elements; and
   the output lines being connected to output terminals provided to an inside from the input terminals.

4. The power converter according to claim 3, wherein the output lines are arranged above the input lines in a vertical direction.

5. The power converter according to any of claim 2, further comprising
   a plurality of capacitors;
   the first switching elements being arranged in a first row,
   the second switching elements being arranged in a second row, and
   the plurality of capacitors being connected to the conversion circuit, the capacitors being arranged to an outside with respect to the first and second rows of the first and second switching elements.

6. The power converter according to claim 5, wherein the capacitors connected to the first switching elements and the capacitors connected to the second switching elements are electrically connected.

7. The power converter according to claim 1, further comprising
a plurality of input lines connected to a respective one of input terminals of the first switching elements and the second switching elements; and
the output lines being connected to output terminals provided to an inside from the input terminals.

8. The power converter according to claim 7, wherein the output lines are arranged above the input lines in a vertical direction.

9. The power converter according to claim 8, wherein
paired ones of the input terminals of the first switching elements and the second switching elements are linearly arranged, and
the input lines extend in a direction in which the paired ones of the input terminals are lined up, and each of the input lines extends from one of the input terminals to another of the input terminals of a respective pair of the paired input terminals.

10. The power converter according to claim 8, further comprising
a plurality of capacitors;
the first switching elements being arranged in a first row,
the second switching elements being arranged in a second row, and
the plurality of capacitors being connected to the conversion circuit, the capacitors being arranged to an outside with respect to the first and second rows of the first and second switching elements.

11. The power converter according to claim 10, wherein the capacitors connected to the first switching elements and the capacitors connected to the second switching elements are electrically connected.

12. The power converter according to claim 8, wherein
paired ones of the input terminals of the first switching elements and the second switching elements are linearly arranged, and
the input lines extend in a direction in which the paired ones of the input terminals are lined up, and each of the input lines extends from one of the input terminals to another of the input terminals of a respective pair of the paired input terminals.

13. The power converter according to claim 7, wherein
paired ones of the input terminals of the first switching elements and the second switching elements are linearly arranged, and
the input lines extend in a direction in which the paired ones of the input terminals are lined up, and each of the input lines extends from one of the input terminals to another of the input terminals of a respective pair of the paired input terminals.

14. The power converter according to claim 7, further comprising
a plurality of capacitors;
the first switching elements being arranged in a first row,
the second switching elements being arranged in a second row, and
the plurality of capacitors being connected to the conversion circuit, the capacitors being arranged to an outside with respect to the first and second rows of the first and second switching elements.

15. The power converter according to claim 14, wherein the capacitors connected to the first switching elements and the capacitors connected to the second switching elements are electrically connected.

16. The power converter according to claim 1, further comprising
a plurality of capacitors;
the first switching elements being arranged in a first row,
the second switching elements being arranged in a second row, and
the plurality of capacitors being connected to the conversion circuit, the capacitors being arranged to an outside with respect to the first and second rows of the first and second switching elements.

17. The power converter according to claim 16, wherein the plurality of capacitors comprise a first portion of the capacitors connected to the first switching elements and a second portion of the capacitors connected to the second switching elements, the first and second portions of the capacitors are electrically connected.

18. The power converter according to claim 17, wherein
each of the first switching elements and the second switching elements including an input terminal,
paired ones of the input terminals of the first switching elements and the second switching elements are linearly arranged, and
the input lines extend in a direction in which the paired ones of the input terminals are lined up, and each of the input lines extends from one of the input terminals to another of the input terminals of a respective pair of the paired input terminals.

19. The power converter according to claim 16, wherein
each of the first switching elements and the second switching elements including an input terminal,
paired ones of the input terminals of the first switching elements and the second switching elements are linearly arranged, and
the input lines extend in a direction in which the paired ones of the input terminals are lined up, and each of the input lines extends from one of the input terminals to another of the input terminals of a respective pair of the paired input terminals.

* * * * *